(12) United States Patent
Markozen

(10) Patent No.: US 6,462,528 B1
(45) Date of Patent: Oct. 8, 2002

(54) METHOD AND APPARATUS FOR PROBING A CONDUCTOR OF AN ARRAY OF CLOSELY-SPACED CONDUCTORS

(75) Inventor: Gene E. Markozen, Beaverton, OR (US)

(73) Assignee: Tektronix, Inc., Beaverton, OR (US)

( * ) Notice: Subject to any disclaimer, the term of this patent is extended or adjusted under 35 U.S.C. 154(b) by 0 days.

(21) Appl. No.: 09/577,239

(22) Filed: May 23, 2000

(51) Int. Cl.[7] ............. G01R 31/02; G01R 1/30
(52) U.S. Cl. ............ 324/72.5; 324/754; 324/757; 324/123 R
(58) Field of Search .............. 324/72.5, 754, 324/720, 721, 713, 757, 123 R; 330/273, 127

(56) References Cited

U.S. PATENT DOCUMENTS 4,403,183 A * 9/1983 Lueker ............ 324/72.5
6,225,816 B1 5/2001 Draving et al.

* cited by examiner

Primary Examiner—N. Le
Assistant Examiner—Anjan K. Deb
(74) Attorney, Agent, or Firm—Thomas F. Lenihan

(57) ABSTRACT

A method and apparatus for probing a terminal of a ball grid array device, or a conductor of an array of closely-spaced conductors, preferably employs a buried tip resistor located substantially adjacent to the point to be monitored. In this way, a relatively short stub is provided from the connection point to the tip resistor. A receiver amplifier arrangement substantially eliminates an offset error affecting prior art amplifier arrangements, where the offset error is introduced into the signal to be measured due to variation in the resistance value of the tip resistor. It is recognized that the invention is not limited to buried-resistor applications, but is also applicable in probing situations involving the use of tip resistors having a tolerance range greater than 1%.

5 Claims, 4 Drawing Sheets

METHOD AND APPARATUS FOR PROBING A CONDUCTOR OF AN ARRAY OF CLOSELY-SPACED CONDUCTORS

FIELD OF THE INVENTION

The subject invention generally concerns the field of probing a device under test, and specifically concerns probing a connection point of a ball grid array (BGA) circuit, or a conductor of a closely-spaced array of conductors (i.e., signal lines).

BACKGROUND OF THE INVENTION

A ball grid array (BGA) device is an integrated circuit having multiple contact points typically arranged in a 50-mil ball-spacing grid formation beneath the body of the integrated circuit. Heretofore, in order to monitor a signal at a particular connection point of a BGA device, it was necessary to route the signals beyond the perimeter of the device via printed circuit traces to reach a particular isolation resistor placed as closely as possible to the BGA device. Unfortunately, these printed circuit traces often traverse a relatively long and circuitous path on their way from the connection point of the BGA to an isolation resistor at the periphery of the BGA package. These less-than-optimum signal paths adversely affect the signal being monitored by causing unacceptable ringing, overshoot, and a plateau close to the reference voltage. The same problem occurs when one is trying to probe conductors of a array of closely-spaced conductors. What is needed is a better solution to the problem of probing BGA devices or closely-spaced conductors that avoids the above-identified problems.

SUMMARY OF THE INVENTION

In a first aspect of the invention, a method and apparatus for probing a terminal of a ball grid array device, or a conductor of an array of closely-spaced conductors, preferably employs a buried tip resistor located substantially adjacent to the point to be monitored. In this way, a relatively short stub is provided from the connection point to the tip resistor.

In a second aspect of the invention, a receiver amplifier arrangement substantially eliminates an offset error that is exhibited in prior art amplifier arrangements, the offset error being introduced into the signal to be measured due to variation in the resistance value of tip resistor.

In a third aspect of the invention, it is recognized that buried resistors are not an essential element of the subject invention, but rather, the subject invention is applicable in probing situations involving the use of tip resistors having a tolerance range greater than 1%.

DETAILED DESCRIPTION OF THE DRAWING

The subject invention allows sampling (i.e., acquiring) of high-speed tight-tolerance digital signals from a microprocessor bus, or the like, while keeping the probing end as small as possible by using buried-resistor technology, despite the poor tolerance typically exhibited by buried resistors.

Figure 1:
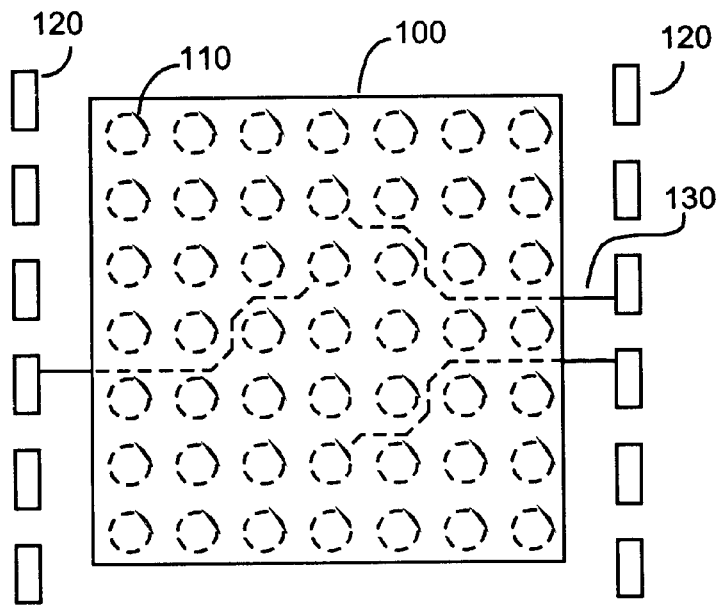
FIG. 1 shows a ball grid array device and tip resistor array in accordance with the prior art.

Referring to FIG. 1, a ball grid array (BGA) device 100 has an array of connection points 110 arranged beneath the device in a grid formation (i.e., typically 50 mils on center, although other ball-grid spacings are used). The connection points are shown as dotted circles to indicate that they are disposed beneath BGA device 100. Arrays of tip (or isolation) resistors 120 are disposed as close as possible along the periphery of the ball grid device. Connection between one of connection points 110 of the ball grid array 100 and the input end of a particular tip resistor of resistor array 120 is accomplished by means of conductive printed circuit traces 130. The tip resistors of resistor array 120 typically have a tolerance of no greater than 5%. These traces 130 may be considered to be the tip of a probe coupled to a connection point 110. As noted above, often these traces 130 or paths (also known as stubs) must follow relatively long and circuitous routes to make these connections. For example, if a BGA device is square and measures 2 inches (approximately 5 cm) on a side, then the shortest path to the input end of the closest tip (i.e., isolation) resistor is 1 inch (2.54 cm) long. These long and often circuitous routes (i.e., long stub lengths) cause the signals being conveyed along these routes to exhibit undesirable ringing, overshoot, or to exhibit a plateau close to a test reference voltage. The term "tip resistor", as used herein, means the input resistor of a probe-like arrangement comprising a printed conductive trace, resistors, a transmission line, and an amplifier.

It is herein recognized that these undesirable effects can be substantially eliminated by placing the tip resistor as close as possible to the BGA connection point to be monitored. It is further herein recognized that the desirable tip resistor placement can be realized through the use of buried resistor technology. That is, the resistors are made small enough to fit within a BGA pad array, and are buried within the layers of a circuit board material, such as FR4.

Figure 2:
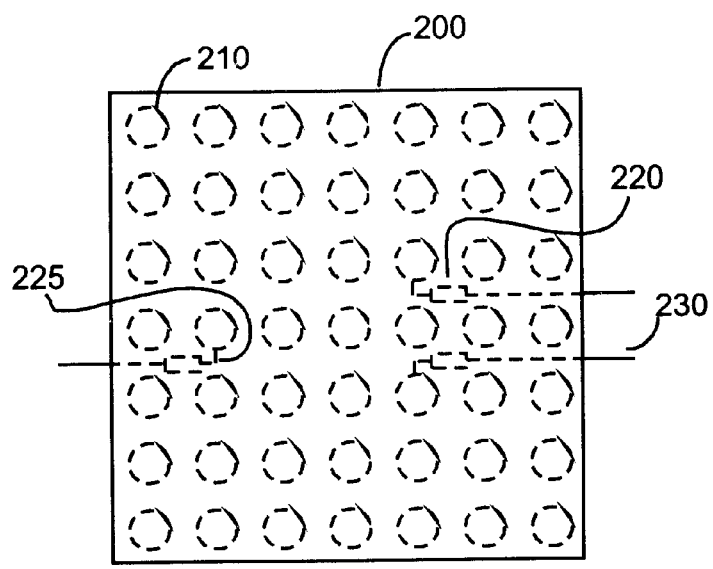
FIG. 2 shows a ball grid array device and buried tip resistors in accordance with the subject invention.

Referring to FIG. 2, a BGA device 200 has an array of connection points (terminals) 210 arranged beneath the device in a grid formation (i.e., typically 50 mils on center). Tip (isolation) resistors 220 are disposed as close as possible to the desired connection points of the ball grid device. Connection between one of connection points 210 of the ball grid array 200 and the input end of a resistor 220 is accomplished by means of relatively short (e.g., 0.01 inch (254 µm)) conductive printed circuit traces. The remaining portion of the path 230 out from beneath the BGA device is isolated by a tip resistor 220, and does not substantially contribute the undesirable effects noted above.

The use of buried resistors solved the routing problem with its associated ringing and overshoot problems, but unfortunately, caused another problem of its own. When buried resistors are made small enough to fit within a 50 mil or smaller ball grid array, or within other arrays of closely-spaced conductors, their resistive tolerance degrades to over +/−20%. Thus, the actual resistance value for a nominal 200-ohm resistor may in fact vary from 160 ohms to 240 ohms. This variation in resistor value causes problems when the buried resistor is used as the "tip" resistor in a traditional passive probing arrangement. It is also herein recognized that the same problem arises when attempting to probe a conductor of an array of closely-spaced conductors. For example, a pin-grid array of terminals on 0.1 inch spacing would still require the use of stubs to bring out the signals from interior connection points to the periphery of the array. In fact, an array on 0.2 inch spacing would still not provide the room to install surface mounted resistors close to the interior pins. Thus, the term closely-spaced conductors, as used herein, means an array of conductors or connection points having a lower limit of a center to center spacing larger than the width of the buried resistor and no greater than 0.2 inches. Over 0.2 inches, surface mount low tolerance solutions exist.

Figure 3:
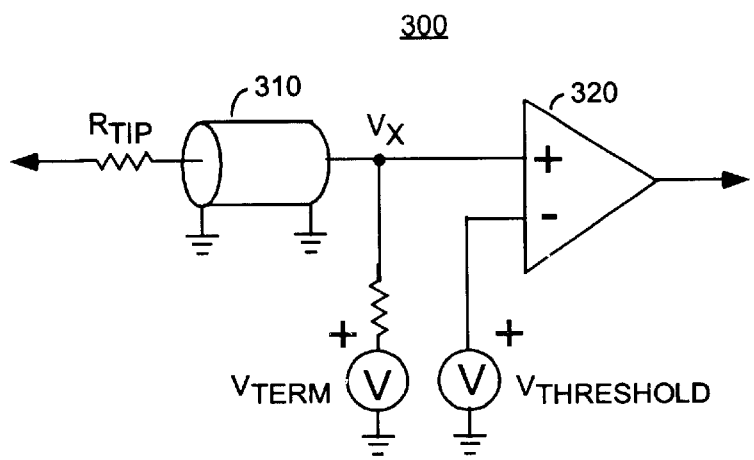
FIG. 3 shows a receiver amplifier arrangement in accordance with the prior art.

FIG. 3 shows a simplified version of such a typical receiver amplifier as known from the prior art. In FIG. 3, resistor $R_{TIP}$ represents a tip (i.e., isolation) resistor 220 of FIG. 2 of the subject invention (assuming that the arrangement of FIG. 2 is used in conjunction with prior art circuit FIG. 3). The signal applied to a probe tip is conveyed through resistor $R_{TIP}$ and transmission line 310 to the plus input of amplifier 320. Transmission Line 310 is said to exhibit an impedance of $Z_O$. The plus input of amplifier 320 is biased by a voltage supply $V_{TERM}$ applied to a node $V_X$ through a termination resistor $R_{TERM}$ which has a resistance approximately equal to $Z_O$. The minus input of amplifier 320 is bias to a threshold voltage by a voltage source $V_{THRESHOLD}$. In operation, amplifier 320 operates as a comparator, producing an output when its input threshold level is traversed. That is, when the signal developed at node $V_X$ exhibits a greater value than the signal applied to the minus input, then amplifier 320 produces a high level output signal. Conversely, when the signal developed at node $V_X$ exhibits an equal or lower value than the signal applied to the minus input, then amplifier 320 produces a low level output signal.

Resistor $R_{TIP}$ limits the probing network load as seen by the probed point. Resistor $R_{TERM}$ represents the termination circuit that matches the impedance of Transmission Line 310 to substantially eliminate reflections from the receiver circuit back into the circuit under test. Source $V_{TERM}$ presents a low impedance return path to the transmission line signal, with a possible non-zero offset in potential. Source $V_{THRESHOLD}$ sets a threshold that is determined to be the center of the expected signal swing, as seen at node $V_X$. That set point will generally correspond to the original signal reference voltage at the probed point (i.e., 1.0 volts for GTL+).

Unfortunately, the topology of FIG. 3 is not suitable for use with the buried tip resistor arrangement of FIG. 2 because of the above-noted resistance variation of resistor $R_{TIP}$. In this regard, note that resistor $R_{TIP}$ and resistor $R_{TERM}$ form a voltage divider, and variation in the value of resistor $R_{TIP}$ adversely affects the voltage divider ratio. This is important because, when $R_{TIP}$ exhibits poor resistive tolerance (i.e., is subject to resistive variation of greater than 1% channel to channel from the nominal value), then edge measurement (i.e., edge placement) accuracy will be poor. This condition is caused by a DC offset developed at summing node $V_X$. This is the result of setting source Vterm to 0 volts (or any other voltage level than the original signal reference voltage). In other words, the resistance variation in $R_{TIP}$ causes signal variation at node $V_X$, and in order to compensate for the signal variation at node $V_X$, the threshold level $V_{THRESHOLD}$ must be made to vary accordingly. Changing the value of $V_{THRESHOLD}$ for each channel is not a practical solution for many applications, because each channel would have to be calibrated based upon the particular value for each individual $R_{TIP}$. It should be noted that the maximum amount of variation in resistor $R_{TIP}$ that can be tolerated depends upon the particular application. Factors that affect this decision are the amount of signal swing, receiver amplifier sensitivity, edge-placement requirements, and ambient noise. For example, when monitoring a GTL+ signal, a comparator having 100 mV differential sensitivity was found to operate in an acceptable fashion even when resistor $R_{TIP}$ had a tolerance of +/−30%.

Figure 4:
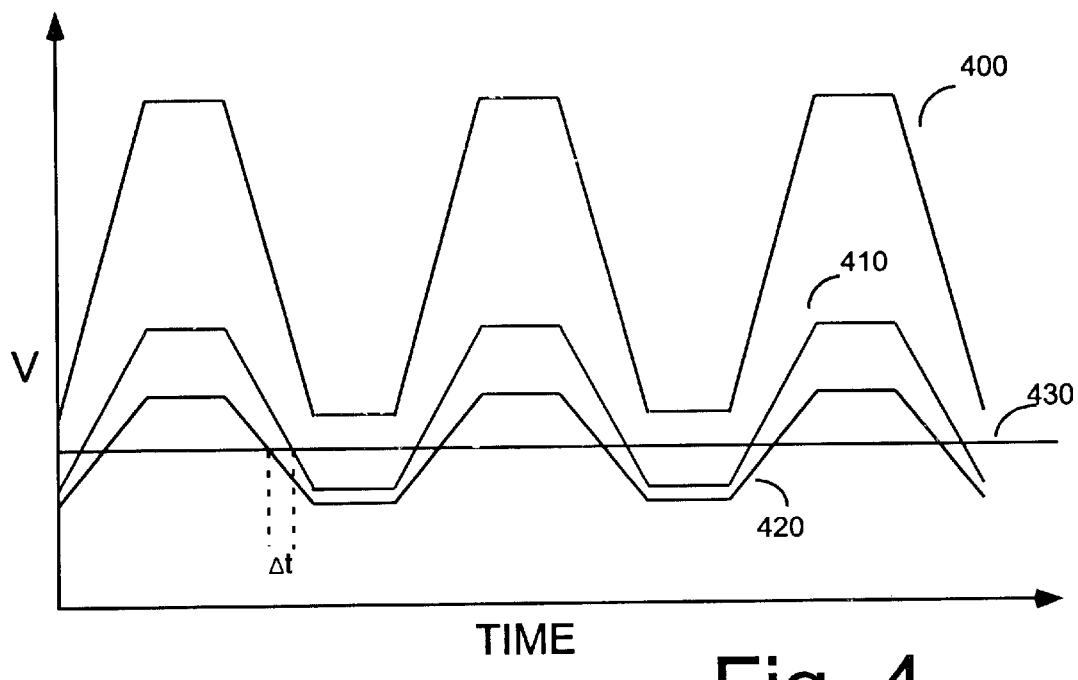
FIG. 4 is an illustration of waveforms exhibiting an offset error due to resistance value variation in the tip resistor ($R_{TIP}$) of FIG. 2.

FIG. 4 is an illustration of waveform diagrams showing the adverse effects of variation in the resistance value of $R_{TIP}$ when source $V_{TERM}$ is set and held to zero volts. In FIG. 4, waveform 400 is the waveform observed at the probe point, and waveforms 410 and 420 are waveforms developed at node $V_X$. Waveform 420 is the expected waveform when resistor $R_{TIP}$ exhibits its nominal value. Waveform 410 has a greater amplitude and offset than does waveform 420, and results from resistor $R_{TIP}$ exhibiting a resistance value less than nominal. Note that the threshold crossing point on waveform 420 is delayed in time by an amount $\Delta t$ due to its undesirable offset. That is, receiver amplifier 320 will see the input voltage developed at node $V_X$ (as represented by waveforms 410 and 420) traverse through the threshold region 430 at different times (i.e., at different points on the waveform).

Figure 5:
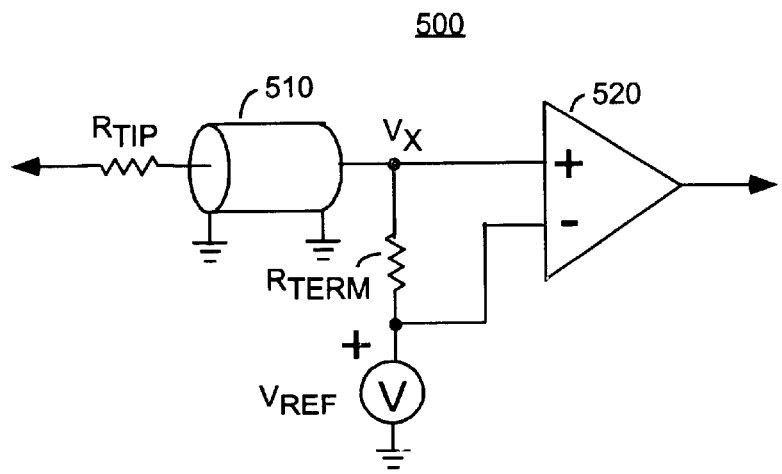
FIG. 5 shows a receiver amplifier arrangement in accordance with the subject invention.

The amplifier arrangement of FIG. 5 has been found to be substantially immune to such resistor $R_{TIP}$ variations, and to significantly reduce the above-noted offset error and corresponding timing error. There are three major differences between the arrangements of FIG. 3 and that of FIG. 5. The first difference is that $V_{TERM}$ has been replaced with $V_{REFERENCE}$. The second difference is that the negative (i.e., minus or inverting) input terminal of amplifier 520 is coupled to $V_{REFERENCE}$. The third, and most important, difference is that $V_{REFERENCE}$ must be set to the same potential as the center of the swing at the probe point (i.e., 1.0 volts for GTL+). One skilled in the art will quickly recognize that the inverting and non-inverting inputs of the amplifier 520 could be swapped (i.e., interchanged) if required by a particular application.

It is important to note that the circuitry of FIG. 5 functions independently with respect to variations in the resistance of resistor $R_{TIP}$. This is true because $V_{REFERENCE}$ (the center of the expected signal swing) is used to terminate the signal seen at node $V_X$. As a result, as the resistance value of resistor $R_{TIP}$ varies, the amplitude of the signal at $V_X$ changes, but the signal swing remains centered about $V_{REFERENCE}$ because the DC component has been removed.

Figure 6:
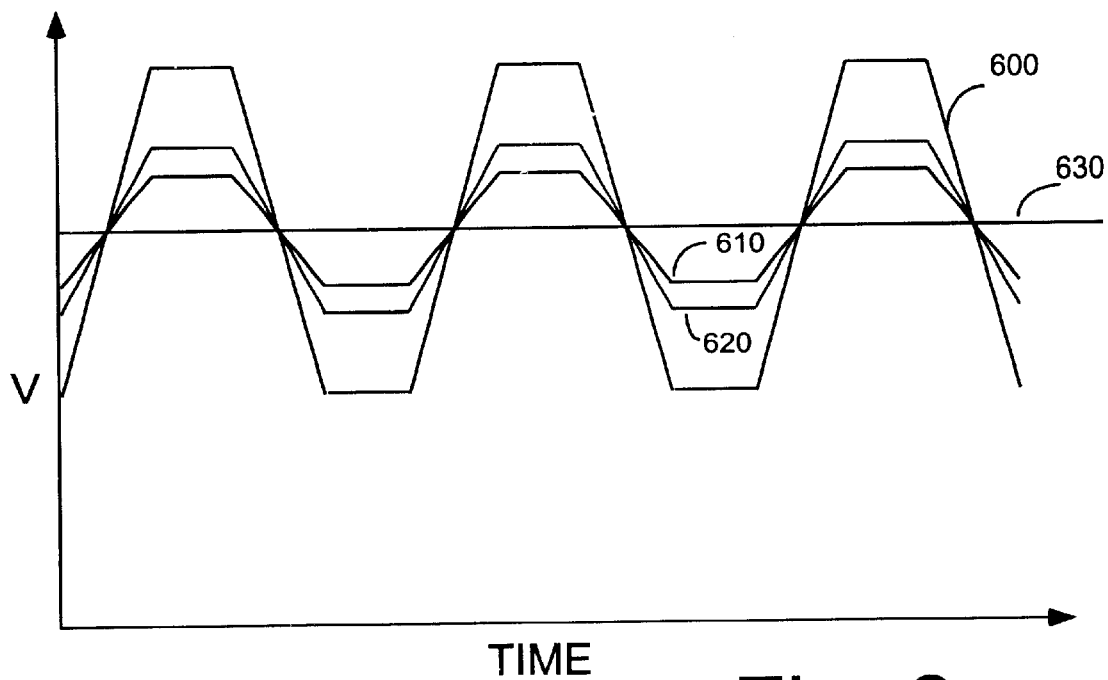
FIG. 6 is an illustration of waveforms exhibiting substantially no offset error despite resistance value variation in the isolation resistors of FIG. 2.

As can be seen in FIG. 6, no DC voltage offset is developed at $V_X$ due to variations in the resistance of resistor $R_{TIP}$. Thus, the edge placement, as seen by receiver amplifier 520, remains constant across a range of $R_{TIP}$ values (i.e., $\Delta t$ has substantially gone to zero and does not appear in FIG. 6).

In addition to passive probing applications, it is herein recognized that the subject invention is also applicable to the field of Logic Analyzers. It is envisioned that the subject invention could be implemented on an acquisition ASIC (Application Specific Integrated Circuit) for a logic analyzer application. In such a logic analyzer application, a similar topology to that of FIG. 5 should be used, a programmable $V_{TERM}$ source would be required.

Figure 7:
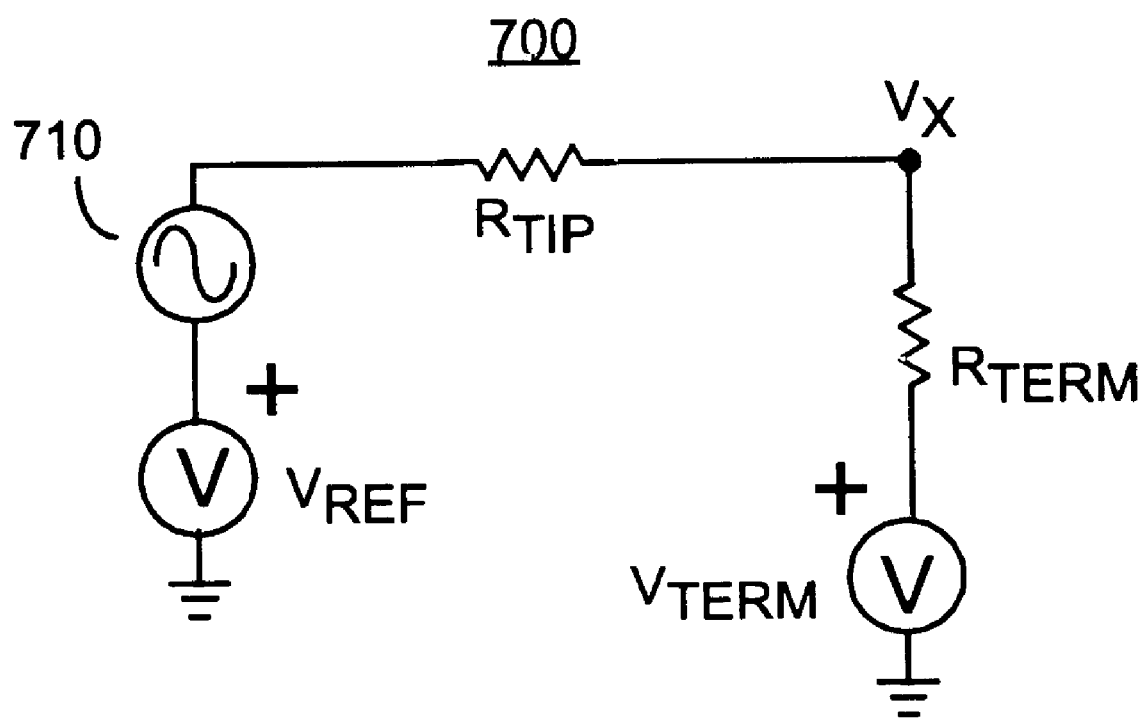
FIG. 7 shows a simplified circuit model useful for understanding the invention.

The following equations show the derivation of the transfer function of the simplified circuit model 700 of FIG. 7. A signal source 710 is modeled as being placed in series its reference voltage source $V_{REF}$. The most important observation one should make is in noting the difference between equation (2) and equation (4). Equation (2) represents the typical prior art passive probing topology of FIG. 3 in which $V_{TERM}$ does not equal $V_{REFERENCE}$. The first term in equation (2) is an attenuated signal term swinging about zero volts. The remaining two terms are DC offset components that will vary in amplitude with variations in resistance value of $R_{TIP}$ as shown in FIG. 4.

However, setting $V_{TERM}$ equal to $V_{REFERENCE}$ in equation (2), dramatically simplifies the terms and results in equation (3). Equation (4) has been reduced to two components; the attenuated AC signal and a fixed DC offset of $V_{REFERENCE}$. As is clearly shown in FIG. 4, there is no effect of $R_{TIP}$ resistance variation in the DC offset. Solving for Vx:

$$Vx = \frac{(V_{SIG} + V_{REF}) * R_{TERM}}{R_{TIP} + R_{TERM}} + \frac{(V_{TERM}) * R_{TIP}}{R_{TIP} + R_{TERM}} \quad \text{Eq. (1)}$$

Expanding:

$$Vx = \frac{V_{SIG} * R_{TERM}}{R_{TIP} + R_{TERM}} + \frac{V_{REF} * R_{TERM}}{R_{TIP} + R_{TERM}} + \frac{V_{TERM} * R_{TIP}}{R_{TIP} + R_{TERM}} \quad \text{Eq. (2)}$$

Setting VTERM=VREF and combining like terms:

$$Vx = \frac{V_{SIG} * R_{TERM}}{R_{TIP} + R_{TERM}} + \frac{V_{REF} * (R_{TIP} + R_{TERM})}{R_{TIP} + R_{TERM}} \quad \text{Eq. (3)}$$

Simplifying:

$$Vx = \frac{V_{SIG} * R_{TERM}}{R_{TIP} + R_{TERM}} + V_{REF} \quad \text{Eq. (4)}$$

While the subject invention was described with respect to buried resistors, it should be noted that it is also useful with any form of loose tolerance resistors (i.e., resistors with a tolerance greater than substantially 1%). It is envisioned that the circuitry described above can be used in conjunction with an oscilloscope, a logic analyzer, or other instrument for monitoring signals from a device under test. While the invention was described with respect to BGA devices, it should be noted that the invention is also useful for probing a conductor of a plurality of closely-conductors (such as a bus), or array of closely spaced conductors.

It should also be noted that, the subject invention is not limited to test and measurement instruments, but may also be used for coupling signals between BGA devices and other circuitry on a printed circuit board. The invention is also useful in applications involving the use of resistive elastomeric connections. In such applications an elastomeric connector is pressed against a circuit point to provide an electrical connection. The amount of resistance varies with the amount of pressure applied to make the connection. In such a case, the elastomer itself can be considered to be the tip resistor of the subject invention, with the pressure variation contributing the poor resistive tolerance. Each of the above modifications is deemed to lie within the scope of the following claims, because they all share the common problem of monitoring a circuit point using a poor tolerance tip resistor, and because a solution to each is provided by the teaching of the subject invention.

What is claimed is:

1. An arrangement for probing a signal at a terminal of an electronic device, comprising:

an input coupled to said terminal for receiving said signal;

a tip resistor having a tolerance in a range greater than 1%, said tip resistor having a first end coupled to said input for receiving said signal, and being physically located substantially adjacent to said terminal of said electronic device;

a transmission line having an input end coupled to a second end of said tip resistor for receiving said signal, and having an output end; and an amplifier having a first input coupled to said output end of said transmission line for receiving said signal and amplifying said signal when said signal exceeds a predetermined reference value;

said amplifier being biased to said reference level, said reference level being substantially identical to a reference level exhibited by said signal at said input;

wherein said amplifier is biased to said reference level by a biasing circuit comprising:

a source of reference level potential; and a second resistor having a first end coupled to said source of reference level potential at a junction, and having a second end coupled to said output end of said transmission line, said transmission line having a characteristic impedance and said second resistor having a value substantially equal to said characteristic impedance; and wherein said junction of said source of reference level potential and said second resistor is coupled to a second input of said amplifier.

2. The arrangement of claim 1, wherein said tip resistor is an isolation resistor, first input of said amplifier is a non-inverting terminal, and said second input of said amplifier is an inverting terminal.

3. An arrangement for probing a signal developed at a terminal of a ball grid array device mounted on a circuit board, said arrangement comprising:

an electrical connection pad formed on said circuit board for connecting to said terminal of said ball grid array device for receiving said signal;

an input coupled to said electrical connection pad for receiving said signal;

an isolation resistor disposed within said circuit board, and being physically located substantially adjacent to said electrical connection pad, said isolation resistor having a first end coupled to said input, and having a second end;

a transmission line having an input end coupled to said second end of said isolation resistor, and an amplifier coupled to said second end of said transmission line for amplifying signals above a predetermined threshold value;

said amplifier being biased to a reference level substantially identical to a reference level exhibited by said signal at said input;

wherein said amplifier is biased to said reference level by a biasing circuit comprising:

a source of reference level potential; and a second resistor having a first end coupled to said source of reference level potential at a junction, and having a second end coupled to said output end of said transmission line, said transmission line having a characteristic impedance and said second resistor having a value substantially equal to said characteristic impedance, and wherein said junction of said source of reference level potential and said second resistor is coupled to a second input of said amplifier.

4. The arrangement of claim 3, wherein said first input of said amplifier is a non-inverting terminal, and said second input of said amplifier is an inverting terminal.

5. A method for probing a signal developed at a conductor of an array of closely-spaced conductors formed on a circuit board, said method comprising the steps of:

coupling an input stub to said conductor for receiving said signal;

placing a tip resistor within said circuit board, said tip resistor being physically located substantially adjacent to said conductor, said tip resistor having a first end coupled to said conductor, and having a second end;

coupling an input end of a transmission line to said second end of said tip resistor, coupling a first input of an amplifier to said second end of said transmission line for amplifying signals above a predetermined threshold value; and biasing said amplifier to a reference level substantially identical to a reference level exhibited by said signal at said one conductor;

wherein the biasing step further including the steps of:
providing a source of reference level potential;
providing a second resistor having a characteristic impedance substantially identical to a characteristic impedance of said transmission line;
coupling a first end of said second resistor to said source of reference level potential at a junction;
coupling a second end of said second resistor to said output end of said transmission line; and coupling said junction to a second input of said amplifier.

* * * * *